(12) United States Patent
Li et al.

(10) Patent No.: US 10,819,124 B2
(45) Date of Patent: Oct. 27, 2020

(54) FAST CHARGING METHOD AND RELATED DEVICE FOR SERIES BATTERY PACK

(71) Applicant: Huawei Technologies Co., Ltd., Shenzhen (CN)

(72) Inventors: Yingtao Li, Shenzhen (CN); Kui Zhou, Dongguan (CN); Guanghui Zhang, Dongguan (CN); Pinghua Wang, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/353,539

(22) Filed: Mar. 14, 2019

(65) Prior Publication Data

US 2019/0214833 A1 Jul. 11, 2019

Related U.S. Application Data

(63) Continuation of application No. PCT/CN2017/089645, filed on Jun. 22, 2017.

(30) Foreign Application Priority Data

Sep. 14, 2016 (CN) .......................... 2016 1 0824336

(51) Int. Cl.
*H02J 7/00* (2006.01)
*G01R 31/382* (2019.01)
(Continued)

(52) U.S. Cl.
CPC ...... *H02J 7/0024* (2013.01); *G01R 19/16542* (2013.01); *G01R 31/382* (2019.01);
(Continued)

(58) Field of Classification Search
CPC . H02J 7/0024; H02J 7/007184; H02J 7/00718
(Continued)

(56) References Cited

U.S. PATENT DOCUMENTS

2009/0286149 A1 11/2009 Ci et al.
2010/0261043 A1* 10/2010 Kim .................. H01M 10/4207
429/61
(Continued)

FOREIGN PATENT DOCUMENTS

CN 101262140 A 9/2008
CN 101277022 A 10/2008
(Continued)

OTHER PUBLICATIONS

Machine Translation and Abstract of Chinese Publication No. CN105703447, Jun. 22, 2016, 14 pages.
(Continued)

*Primary Examiner* — Richard V Muralidar
(74) *Attorney, Agent, or Firm* — Conley Rose, P.C.

(57) ABSTRACT

A fast charging method, a fast charging system, and a fast charging apparatus for a series battery pack, where the fast charging method including obtaining charge parameters of battery units in a series battery pack, determining, based on the charge parameters, whether there is a differentiated battery unit in the series battery pack, where the differentiated battery unit is a battery unit whose charge parameter is different from a charge parameter of the rest battery units in the series battery pack, and changing the battery units in the series battery pack to a parallel connection when there is a differentiated battery unit in the series battery pack, and performing parallel charging on the battery units. Hence, the fast charging method for a series battery pack can effectively shorten a charging time.

20 Claims, 9 Drawing Sheets

(51) Int. Cl.
*G01R 19/165* (2006.01)
*H01M 10/44* (2006.01)

(52) U.S. Cl.
CPC ....... *H01M 10/441* (2013.01); *H02J 7/00718* (2020.01); *H02J 7/007184* (2020.01)

(58) Field of Classification Search
USPC .......................................................... 320/117
See application file for complete search history.

(56) References Cited

U.S. PATENT DOCUMENTS

| | | | | |
|---|---|---|---|---|
| 2011/0001456 | A1* | 1/2011 | Wang | H02J 7/0016 320/117 |
| 2014/0015488 | A1* | 1/2014 | Despesse | H01M 10/425 320/122 |
| 2016/0126766 | A1* | 5/2016 | Zhang | G01R 31/387 320/116 |
| 2019/0214832 | A1* | 7/2019 | Li | H02J 7/0024 |

FOREIGN PATENT DOCUMENTS

| | | |
|---|---|---|
| CN | 101777675 A | 7/2010 |
| CN | 203747439 U | 7/2014 |
| CN | 205051404 U | 2/2016 |
| CN | 105703447 A | 6/2016 |
| CN | 106374559 A | 2/2017 |
| DE | 202006008476 U1 | 8/2006 |
| EP | 2528155 A1 | 11/2012 |
| EP | 2669988 A1 | 12/2013 |
| JP | 2006187113 A | 7/2006 |

OTHER PUBLICATIONS

Machine Translation and Abstract of German Publication No. DE202006008476, Aug. 10, 2006, 6 pages.
Foreign Communication From a Counterpart Application, European Application No. 17850067.4, Extended European Search Report dated Jul. 12, 2019, 5 pages.
Machine Translation and Abstract of Chinese Publication No. CN101262140, Sep. 10, 2008, 15 pages.
Machine Translation and Abstract of Chinese Publication No. CN101277022, Oct. 1, 2008, 7 pages.
Machine Translation and Abstract of Chinese Publication No. CN101777675, Jul. 14, 2010, 31, pages.
Machine Translation and Abstract of Chinese Publication No. CN106374559, Feb. 1, 2017, 35 pages.
Machine Translation and Abstract of Chinese Publication No. CN203747439, Jul. 30, 2014, 9 pages.
Machine Translation and Abstract of Chinese Publication No. CN205051404, Feb. 24, 2016, 12 pages.
Machine Translation and Abstract of Japanese Publication No. JP2006187113, Jul. 13, 2006, 28 pages.
Foreign Communication From a Counterpart Application, PCT Application No. PCT/CN2017/089645, English Translation of International Search Report dated Aug. 25, 2017, 2 pages.
Foreign Communication From a Counterpart Application, PCT Application No. PCT/CN2017/089645, English Translation of Written Opinion dated Aug. 25, 2017, 4 pages.

* cited by examiner

Cell 1        Cell 2         Cell 3         Cell 4
12 V 50 Ah   12 V 100 Ah   12 V 100 Ah   12 V 100 Ah

FAST CHARGING METHOD AND RELATED DEVICE FOR SERIES BATTERY PACK

CROSS-REFERENCE TO RELATED APPLICATIONS

This application is a continuation of International Patent Application No. PCT/CN2017/089645 filed on Jun. 22, 2017, which claims priority to Chinese Patent Application No. 201610824336.9 filed on Sep. 14, 2016. The disclosures of the aforementioned applications are hereby incorporated by reference in their entireties.

TECHNICAL FIELD

The present disclosure relates to the field of fast charging technologies for batteries, and in particular, to a fast charging method and related device for a series battery pack.

BACKGROUND

Power lithium-ion batteries have such advantages as a high nominal voltage, high specific energy, high charging and discharging efficiency, and a long service life, and are currently widely used in the fields of electric cars, battery energy storage, and the like. In use of lithium-ion batteries, cells are connected in series to achieve a specific voltage level, and batteries also need to be connected in parallel to achieve a specific capacity level in order to meet voltage and power requirements. A battery pack is usually composed of tens to hundreds of cells connected in series or connected first in parallel and then in series.

A battery pack is formed by combining a plurality of low-voltage and small-capacity cells in series, in parallel, or in a mixed connection manner, and charging can be applied only to the entire battery pack, resulting in a relatively long charging time. In addition, in circumstances of a current battery manufacturing technology, cells do not have identical battery parameters during manufacturing, grouping, use, maintenance, and other activities. Therefore, when the plurality of cells are charged after being connected in series, it is impossible that all the cells could be fully charged to achieve a same voltage. As a result, system performance of the entire battery pack is apt to degrade, and a system capacity and a cyclic life are also affected.

SUMMARY

Embodiments of the present disclosure provide a fast charging method, system and apparatus for a series battery pack in order to resolve a problem of a limited charging speed due to existence of a differentiated battery unit in a series battery pack, shorten a charging time of the series battery pack, and improve charging efficiency.

A first aspect of the embodiments of the present disclosure provides a fast charging method for a series battery pack, including obtaining charge parameters of battery units in a series battery pack, determining, based on the charge parameters, whether there is a differentiated battery unit in the series battery pack, where the differentiated battery unit is a battery unit whose charge parameter is different from a charge parameter of the rest battery units in the series battery pack, and if there is a differentiated battery unit in the series battery pack, changing the battery units in the series battery pack to a parallel connection, and performing parallel charging on the battery units.

When there is a differentiated battery unit in the series battery pack, the battery units in the series battery pack are changed to a parallel connection, and parallel charging is performed on the battery units. This can effectively reduce impact of the differentiated battery unit on a charging current of the entire battery pack, and prevent a lower charging current and a prolonged charging time from being caused for the entire battery pack due to a limited maximum charging current of the differentiated battery unit, helping increase a charging speed of the series battery pack.

With reference to the first aspect, in a first possible implementation of the first aspect, determining, based on the charge parameters, whether there is a differentiated battery unit in the series battery pack includes obtaining a charge parameter characteristic curve of each battery unit in the series battery pack, where the charge parameter characteristic curve is used to define a characteristic how a charge parameter of the battery unit changes with a charge cycle quantity of the battery unit, obtaining a charge cycle quantity of each battery unit in the series battery pack, and determining, based on the charge parameter characteristic curve, a charge parameter characteristic value of each battery unit at a corresponding charge cycle quantity, and comparing the charge parameter of each battery unit with the charge parameter characteristic value of the corresponding battery unit, and if there is a battery unit whose charge parameter is less than a charge parameter characteristic value by more than a preset threshold, determining that there is a differentiated battery unit in the series battery pack.

The charge parameter characteristic curve is determined by factors such as a selected material and a battery structure of the battery unit, and generally, batteries of a same model have a same charge parameter characteristic curve. Therefore, comparing the charge parameter of each battery unit with the charge parameter characteristic value at the corresponding charge cycle quantity can accurately determine whether the corresponding battery unit is a differentiated battery unit.

With reference to the first aspect or the first possible implementation of the first aspect, in a second possible implementation of the first aspect, the changing the battery units in the series battery pack to a parallel connection, and performing parallel charging on the battery units includes controlling, by controlling switching transistors in a switch array module to be on or off, the battery units in the series battery pack to change to an all-parallel connection, and performing all-parallel charging on the battery units, or controlling, by controlling switching transistors in a switch array module to be on or off, the battery units in the series battery pack to change to a series-parallel connection, and performing series-parallel charging on the battery units.

When all-parallel charging is performed, a highest parallel charging current can be obtained, as well as a highest charging current in a charging trunk and a shortest charging time. When series-parallel charging is performed, because of existence of a series connection, a charging voltage increases correspondingly, and a smaller quantity of parallel batteries can relax a requirement on a current of the charging trunk.

With reference to the first aspect or the first possible implementation of the first aspect, in a third possible implementation of the first aspect, before changing the battery units in the series battery pack to a parallel connection, the method further includes obtaining a maximum charging current allowed by a charging trunk and a charging current of all-parallel charging, and comparing the charging current of all-parallel charging with the maximum charging current allowed by the charging trunk.

With reference to the third possible implementation of the first aspect, in a fourth possible implementation of the first aspect, if the maximum charging current allowed by the charging trunk is greater than or equal to the charging current of all-parallel charging, changing the battery units in the series battery pack to a parallel connection, and performing parallel charging on the battery units includes changing the battery units in the series battery pack to an all-parallel connection, and performing all-parallel charging on the battery units.

With reference to the third possible implementation of the first aspect, in a fifth possible implementation of the first aspect, if the maximum charging current allowed by the charging trunk is less than the charging current of all-parallel charging, changing the battery units in the series battery pack to a parallel connection, and performing parallel charging on the battery units includes changing the battery units in the series battery pack to a series-parallel connection, and performing series-parallel charging on the battery units.

The maximum charging current allowed by the charging trunk and the charging current of all-parallel charging are obtained, and the maximum charging current allowed by the charging trunk is compared with the charging current of all-parallel charging in order to determine whether the charging current of all-parallel charging exceeds the maximum charging current allowed by the charging trunk, and when the charging current of all-parallel charging exceeds the maximum charging current allowed by the charging trunk, change the battery units in the series battery pack to a series-parallel connection, and perform series-parallel charging on the battery units. This can prevent slower all-parallel charging from being caused by a limitation of the maximum charging current allowed by the charging trunk.

With reference to the fifth possible implementation of the first aspect, in a sixth possible implementation of the first aspect, changing the battery units in the series battery pack to a series-parallel connection includes calculating, based on the maximum charging current allowed by the charging trunk and maximum charging currents of the battery units, a maximum quantity of battery units allowed to be connected in parallel, and changing the battery units in the series battery pack to the series-parallel connection based on the maximum quantity of battery units allowed to be connected in parallel.

The maximum quantity of battery units allowed to be connected in parallel by the charging trunk is calculated based on the maximum charging current allowed by the charging trunk and the maximum charging currents of the battery units in order to make full use of a charging capacity of the charging trunk to ensure that a highest current is input to the battery pack when series-parallel charging is performed, thereby obtaining a highest series-parallel charging speed.

With reference to the fifth possible implementation of the first aspect or the sixth possible implementation of the first aspect, in a seventh possible implementation of the first aspect, after performing series-parallel charging on the battery units, the method further includes monitoring charging statuses of the battery units, if detecting that charging of the differentiated battery unit is completed, making a charging loop bypass the differentiated battery unit using a bypass switching transistor, in a switch array module, connected to the differentiated battery unit, and re-determining a maximum charging current based on a quantity of the remaining battery units, and performing charging on the remaining battery units using the re-determined maximum charging current.

When detecting that charging of the differentiated battery unit is completed, the charging loop is made to bypass the differentiated battery unit. Because the differentiated battery unit limiting the charging current is bypassed, the remaining battery units can all be charged using a normal maximum charging current. Therefore, the maximum charging current can be re-determined based on the quantity of the remaining battery units. This helps shorten a charging time of the entire battery pack.

With reference to the first aspect or the first possible implementation of the first aspect, in an eighth possible implementation of the first aspect, after performing parallel charging on the battery units, the method further includes monitoring charging statuses of the battery units, if detecting that charging of the battery units is completed, ending charging of the battery units, and changing the battery units back to a series connection, or changing the battery units to a parallel connection or a series-parallel connection based on a load power requirement.

A second aspect of the embodiments of the present disclosure provides a fast charging system for a series battery pack, including an alternating current (AC)/direct current (DC) conversion module, a charging control module, a switch array module, and a series battery pack module, where the AC/DC conversion module is connected to the charging control module, and is configured to convert, to a DC signal, an AC signal provided by an external power supply, and the charging control module is connected to the series battery pack module using the switch array module, the series battery pack module includes a plurality of battery units connected in series, and the charging control module is configured to obtain charge parameters of the battery units, and determine, based on the charge parameters, whether there is a differentiated battery unit in the series battery pack module, where the differentiated battery unit is a battery unit whose charge parameter is different from a charge parameter of the rest battery units in the series battery pack module, and when there is a differentiated battery unit in the series battery pack module, control the switch array module to change the battery units in the series battery pack module to an all-parallel connection or a series-parallel connection, and perform all-parallel charging or series-parallel charging on the battery units using the DC signal that is output by the AC/DC conversion module.

When there is a differentiated battery unit in the series battery pack, the battery units in the series battery pack are changed to a parallel connection, and parallel charging is performed on the battery units. This can effectively reduce impact of the differentiated battery unit on a charging current of the entire battery pack, and prevent a lower charging current and a prolonged charging time from being caused for the entire battery pack due to a limited maximum charging current of the differentiated battery unit, helping increase a charging speed of the series battery pack.

With reference to the second aspect, in a first possible implementation of the second aspect, the charging control module is further configured to obtain a maximum charging current allowed by a charging trunk and a charging current of all-parallel charging, and compare the charging current of all-parallel charging with the maximum charging current allowed by the charging trunk, and if the maximum charging current allowed by the charging trunk is greater than or equal to the charging current of all-parallel charging, control the switch array module to change the battery units in the series battery pack module to an all-parallel connection, or if the maximum charging current allowed by the charging trunk is less than the charging current of all-parallel charging, control the switch array module to change the battery units in the series battery pack module to a series-parallel connection.

The maximum charging current allowed by the charging trunk and the charging current of all-parallel charging are obtained, and the maximum charging current allowed by the charging trunk is compared with the charging current of all-parallel charging in order to determine whether the charging current of all-parallel charging exceeds the maximum charging current allowed by the charging trunk, and when the charging current of all-parallel charging exceeds the maximum charging current allowed by the charging trunk, change the battery units in the series battery pack to a series-parallel connection, and perform series-parallel charging on the battery units. This can prevent slower all-parallel charging from being caused by a limitation of the maximum charging current allowed by the charging trunk.

With reference to the second aspect or the first possible implementation of the second aspect, in a second possible implementation of the second aspect, the switch array module includes a plurality of switching transistors and a plurality of bypass switches, each of the switching transistors is connected to at least one of the battery units, and each of the bypass switches is connected to at least one of the battery units, and the switch array module is configured to control, by changing an on or off state of the plurality of switching transistors, the battery units to change between a series connection, a parallel connection, and a series-parallel connection, and implement charging protection or discharging protection on the battery units by changing an on or off state of the plurality of bypass switches.

With reference to the second possible implementation of the second aspect, in a third possible implementation of the second aspect, the charging control module includes a charging power adjustment circuit and a charging monitoring circuit, the charging power adjustment circuit is configured to obtain a charging power requirement of the battery units that have been changed to the all-parallel connection or the series-parallel connection, and adjust a charging power based on the charging power requirement, and the charging monitoring circuit is configured to monitor charging status parameters of the battery units, and implement charging protection on the battery units based on the charging status parameters by controlling the bypass switches in the switch array module to be on or off.

With reference to the second possible implementation of the second aspect, in a fourth possible implementation of the second aspect, the fast charging system further includes a discharging control module, and the discharging control module is connected to the series battery pack module using the switch array module, and is configured to obtain a load power requirement, and adjust a discharging power of the series battery pack module based on the load power requirement by controlling the switch array module.

With reference to the fourth possible implementation of the second aspect, in a fifth possible implementation of the second aspect, the discharging control module includes a discharging power adjustment circuit and a discharging monitoring circuit, the discharging power adjustment circuit is configured to control, based on the load power requirement by controlling the switching transistors in the switch array module to be on or off, the battery units in the series battery pack to change to a parallel connection or a series-parallel connection, and the discharging monitoring circuit is configured to monitor discharging status parameters of the battery units, and implement discharging protection on the battery units based on the discharging status parameters by controlling the bypass switches in the switch array module to be on or off.

With reference to any one of the second aspect, the first possible implementation of the second aspect, and the third possible implementation of the second aspect to the fifth possible implementation of the second aspect, in a sixth possible implementation of the second aspect, the fast charging system further includes a DC/DC conversion module, and the DC/DC conversion module is connected to the discharging control module, and is configured to convert, to a high-voltage DC signal, a low-voltage DC signal that is output by the series battery pack module, and supply power to a load using the high-voltage DC signal.

A third aspect of the embodiments of the present disclosure provides a fast charging apparatus for a series battery pack, including a charge parameter obtaining unit configured to obtain charge parameters of battery units in a series battery pack, a differentiated battery determining unit configured to determine, based on the charge parameters, whether there is a differentiated battery unit in the series battery pack, where the differentiated battery unit is a battery unit whose charge parameter is different from a charge parameter of the rest battery units in the series battery pack, and a connection relationship changing unit configured to, when there is a differentiated battery unit in the series battery pack, change the battery units in the series battery pack to a parallel connection, and perform parallel charging on the battery units.

With reference to the third aspect, in a first possible implementation of the third aspect, the differentiated battery determining unit includes a characteristic curve obtaining subunit configured to obtain a charge parameter characteristic curve of each battery unit in the series battery pack, where the charge parameter characteristic curve is used to define a characteristic how a charge parameter of the battery unit changes with a charge cycle quantity of the battery unit, a charge cycle quantity obtaining subunit configured to obtain a charge cycle quantity of each battery unit in the series battery pack, and determine, based on the charge parameter characteristic curve, a charge parameter characteristic value of each battery unit at a corresponding charge cycle quantity, and a charge parameter comparison subunit configured to compare the charge parameter of each battery unit with the charge parameter characteristic value of the corresponding battery unit, and if there is a battery unit whose charge parameter is less than a charge parameter characteristic value by more than a preset threshold, determine that there is a differentiated battery unit in the series battery pack.

With reference to the third aspect, in a second possible implementation of the third aspect, the connection relationship changing unit is configured to control, by controlling switching transistors in a switch array module to be on or off, the battery units in the series battery pack to change to an all-parallel connection, and perform all-parallel charging on the battery units, or control, by controlling switching transistors in a switch array module to be on or off, the battery units in the series battery pack to change to a series-parallel connection, and perform series-parallel charging on the battery units.

With reference to the third aspect, in a third possible implementation of the third aspect, the fast charging apparatus for a series battery pack further includes a charging current obtaining unit configured to obtain a maximum charging current allowed by a charging trunk and a charging current of all-parallel charging, and a charging current comparison unit configured to compare the charging current of all-parallel charging with the maximum charging current allowed by the charging trunk.

With reference to the third possible implementation of the third aspect, in a fourth possible implementation of the third aspect, if the maximum charging current allowed by the charging trunk is greater than or equal to the charging current of all-parallel charging, the connection relationship changing unit is further configured to change the battery units in the series battery pack to an all-parallel connection, and perform all-parallel charging on the battery units.

With reference to the third possible implementation of the third aspect, in a fifth possible implementation of the third aspect, if the maximum charging current allowed by the charging trunk is less than the charging current of all-parallel charging, the connection relationship changing unit is further configured to change the battery units in the series battery pack to a series-parallel connection, and perform series-parallel charging on the battery units.

With reference to the third possible implementation of the third aspect, in a sixth possible implementation of the third aspect, the charging current comparison unit is further configured to calculate, based on the maximum charging current allowed by the charging trunk and maximum charging currents of the battery units, a maximum quantity of battery units allowed to be connected in parallel, and the connection relationship changing unit is further configured to change the battery units in the series battery pack to the series-parallel connection based on the maximum quantity of battery units allowed to be connected in parallel.

With reference to the third possible implementation of the third aspect, in a seventh possible implementation of the third aspect, the fast charging apparatus for a series battery pack further includes a charging status monitoring unit configured to monitor charging statuses of the battery units, and a bypass protection control unit configured to, when the charging status monitoring unit detects that charging of the differentiated battery unit is completed, make a charging loop bypass the differentiated battery unit using a bypass switching transistor, in a switch array module, connected to the differentiated battery unit, and the charging current comparison unit is further configured to re-determine a maximum charging current based on a quantity of the remaining battery units, and perform charging on the remaining battery units using the re-determined maximum charging current.

With reference to the seventh possible implementation of the third aspect, in an eighth possible implementation of the third aspect, the charging status monitoring unit is further configured to monitor charging statuses of the battery units, and if detecting that charging of the battery units is completed, end charging of the battery units, and the connection relationship changing unit is further configured to change the battery units back to a series connection, or change the battery units to a parallel connection or a series-parallel connection based on a load power requirement.

When there is a differentiated battery unit in the series battery pack, the fast charging apparatus for a series battery pack changes the battery units in the series battery pack to a parallel connection, and performs parallel charging on the battery units. This can effectively reduce impact of the differentiated battery unit on a charging current of the entire battery pack, and prevent a lower charging current and a prolonged charging time from being caused for the entire battery pack due to a limited maximum charging current of the differentiated battery unit, helping increase a charging speed of the series battery pack.

BRIEF DESCRIPTION OF DRAWINGS

To describe the technical solutions in some of the embodiments of the present disclosure more clearly, the following briefly describes the accompanying drawings describing some of the embodiments.

DESCRIPTION OF EMBODIMENTS

The following describes the embodiments of the present disclosure with reference to the accompanying drawings.

For a device powered by a rechargeable battery, for example, an electric car, to obtain a relatively high voltage output, a battery pack is usually formed by connecting a plurality of battery units in series. Due to poor consistency between the battery units forming the series battery pack, application performance of the battery units also differs when the series battery pack is used, hence a "bucket effect". When the series battery pack is being charged, a current of an entire charging circuit often becomes lower and a charging time becomes longer because of a limitation of a charging current of one battery unit. In the embodiments of the present disclosure, to resolve the problem of a long charging time for a series battery pack, a differentiated battery unit causing the "bucket effect" is identified from the battery pack, and the differentiated battery unit is connected to the rest battery units in a parallel or series-parallel manner, to increase a charging current in an entire charging trunk, and reduce impact of the "bucket effect" of the differentiated battery unit on the charging current, thereby shortening the charging time of the entire battery pack.

Figure 1:
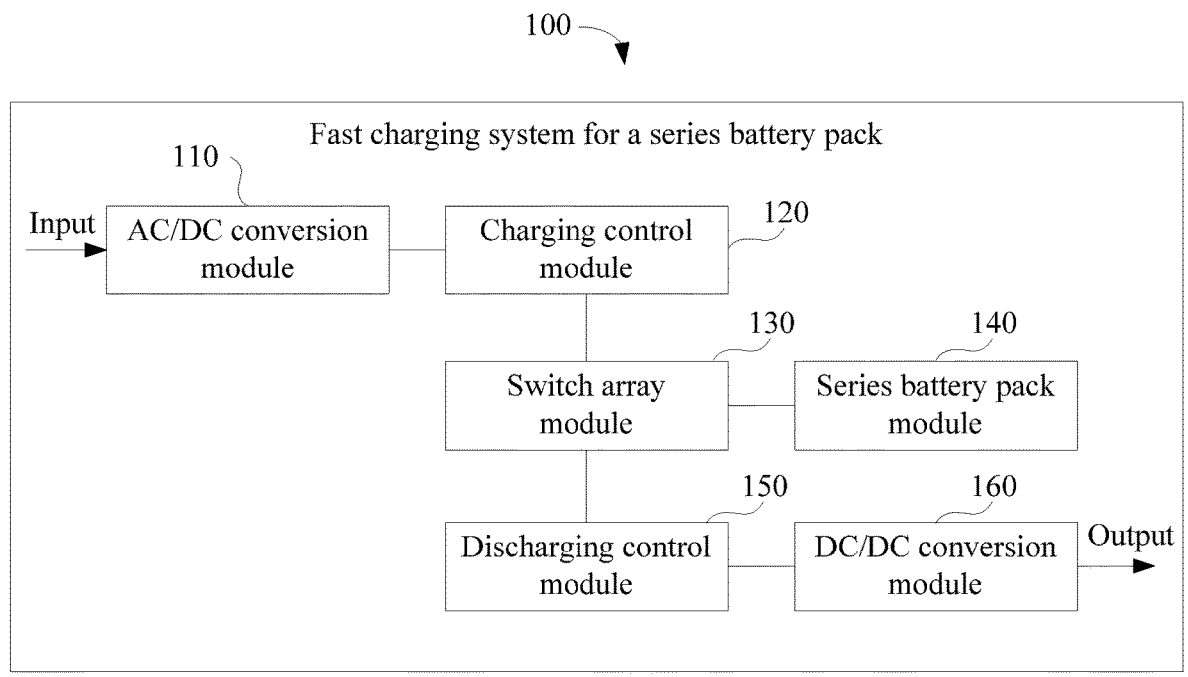
FIG. 1 is a first schematic structural diagram of a fast charging system for a series battery pack according to an embodiment of the present disclosure.

Referring to FIG. 1, in an embodiment of the present disclosure, a fast charging system 100 for a series battery pack is provided, including an AC/DC conversion module 110, a charging control module 120, a switch array module 130, a series battery pack module 140, a discharging control module 150, and a DC/DC conversion module 160.

The AC/DC conversion module 110 is connected to the charging control module 120, and is configured to convert, to a DC signal, an AC signal provided by an external power supply (not shown in FIG. 1), and provide a charging current and voltage to the series battery pack module 140 using the DC signal.

The charging control module 120 is connected to the series battery pack module 140 using the switch array module 130. The series battery pack module 140 includes a plurality of battery units 141 connected in series (referring to FIG. 2). The charging control module 120 is configured to obtain charge parameters of the battery units 141, and determine, based on the charge parameters, whether there is a differentiated battery unit in the series battery pack module 140, where the differentiated battery unit is a battery unit whose charge parameter is different from a charge parameter of the rest battery units 141 in the series battery pack module 140, and when there is a differentiated battery unit in the series battery pack module 140, control the switch array module 130 to change the battery units 141 in the series battery pack module 140 to an all-parallel connection or a series-parallel connection, and perform all-parallel charging or series-parallel charging on the battery units 141 using the DC signal that is output by the AC/DC conversion module 110.

The discharging control module 150 is connected to the series battery pack module 140 using the switch array module 130, and is configured to obtain a load power requirement of a load (not shown in FIG. 1), and adjust a discharging power of the series battery pack module 140 based on the load power requirement by controlling the switch array module 130.

The DC/DC conversion module 160 is connected to the discharging control module 150, and is configured to convert, to a high-voltage DC signal, a low-voltage DC signal that is output by the series battery pack module 140, and supply power to the load using the high-voltage DC signal.

Figure 2:
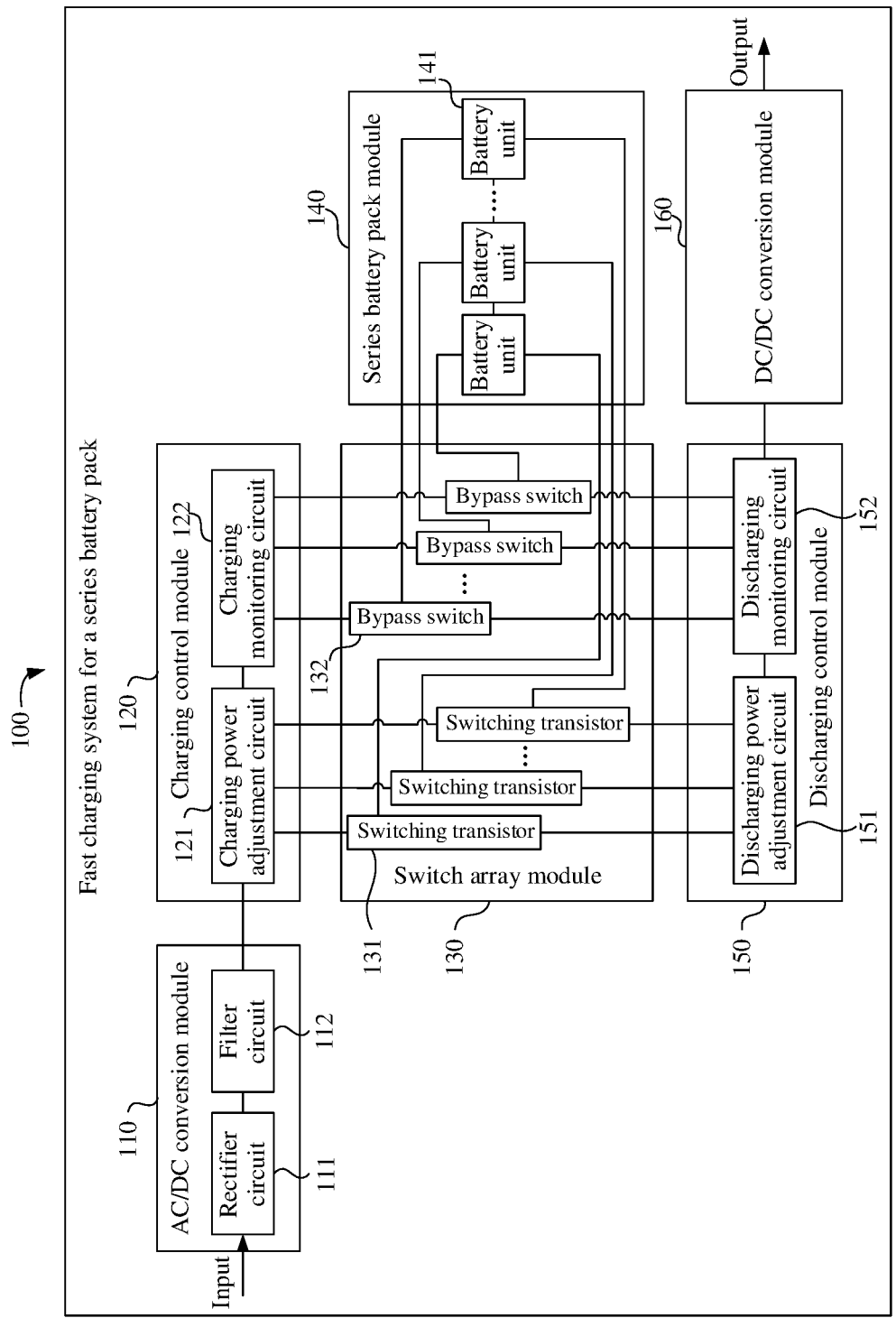
FIG. 2 is a second schematic structural diagram of a fast charging system for a series battery pack according to an embodiment of the present disclosure.

Referring to FIG. 2, in an implementation, the AC/DC conversion module 110 includes a rectifier circuit 111 and a filter circuit 112. The rectifier circuit 111 is connected to the filter circuit 112. The rectifier circuit 111 is configured to convert, to the DC signal, the AC signal provided by the external power supply. The filter circuit 112 is configured to perform filtering processing on the DC signal that is output by the rectifier circuit 111. The filter circuit 112 is further connected to the charging control module 120, and is configured to send the filtering-processed DC signal to the charging control module 120.

The charging control module 120 includes a charging power adjustment circuit 121 and a charging monitoring circuit 122. The charging power adjustment circuit 121 is connected to the filter circuit 112 and the series battery pack module 140, and is configured to obtain a charging power requirement of the battery units 141 in the series battery pack module 140, and adjust a charging power based on the charging power requirement. The charging monitoring circuit 122 is connected to the series battery pack module 140 using the switch array module 130, and is configured to monitor charging status parameters of the battery units 141 in the series battery pack module 140, and implement charging protection on the battery units 141 based on the charging status parameters by controlling the switch array module 130. The charging status parameter may be a voltage, a current, a temperature, an internal resistance, or the like.

The switch array module 130 includes a plurality of switching transistors 131 and a plurality of bypass switches 132. Each of the switching transistors 131 is connected to at least one of the battery units 141. Each of the bypass switches 132 is connected to at least one of the battery units 141. The switch array module 130 is configured to control, by changing an on or off state of the plurality of switching transistors 131, the battery units 141 to change between a series connection, a parallel connection, and a series-parallel connection, and implement charging protection or discharging protection on the battery units 141 based on the charging status parameters of the battery units 141 in the series battery pack module 140 that are monitored by the charging monitoring circuit 122, by changing an on or off state of the plurality of bypass switches 132. The switching transistors 131 and the bypass switches 132 may be Metal-Oxide Semiconductor Field-Effect Transistors (MOSFETs), relays, electronic switches, or the like.

The battery unit 141 in the series battery pack module 140 may be a combination of a plurality of cells, for example, a combination of a plurality of cells connected in a parallel, series, or series-parallel manner, or may be a cell. All the battery units 141 are connected to the switch array module 130. The series battery pack module 140 may change a connection relationship between the battery units, based on the switching transistors in the switch array module 130 to be on or off, for example, changing between a series connection, a parallel connection, and a series-parallel connection. In addition, the series battery pack module 140 may connect a corresponding battery unit to a charging or discharging loop or make a charging or discharging loop bypass a corresponding battery unit by controlling the bypass switches in the switch array module 130 to be on or off in order to implement charging and discharging protection on the battery units.

The discharging control module 150 includes a discharging power adjustment circuit 151 and a discharging monitoring circuit 152. The discharging power adjustment circuit 151 is connected to the series battery pack module 140 using the switch array module 130 and is connected to the load (not shown in FIG. 2) using the DC/DC conversion module 160, and is configured to obtain the load power requirement, and control, based on the load power requirement by controlling the switching transistors in the switch array module 130 to be on or off, the battery units 141 in the series battery pack module 140 to change to a parallel connection or a series-parallel connection. The discharging monitoring circuit 152 is connected to the series battery pack module 140 using the switch array module 130, and is configured to monitor discharging status parameters of the battery units 141 in the series battery pack module 140, and implement discharging protection on the battery units based on the discharging status parameters by controlling the bypass switches in the switch array module 130 to be on or off. The discharging status parameter may be a voltage, a current, a temperature, an internal resistance, or the like.

In the fast charging system 100 for a series battery pack, the switch array module 130 is deployed between the charging control module 120 and the series battery pack module 140, and the battery units 141 in the series battery pack module 140 are controlled to change between a series connection, a parallel connection, and a series-parallel connection by controlling the switching transistors 131 in the switch array module 130 to be on or off such that when the series battery pack module 140 is charged, a series/parallel relationship between the battery units can be flexibly adjusted based on a performance status of the battery units 141 (for example, whether there is a differentiated battery unit), thereby reducing impact on a charging speed due to existence of the differentiated battery unit in the series battery pack module 140, helping increase a charging current, and improving charging efficiency.

In an implementation, the charging control module 120 is further configured to obtain a maximum charging current allowed by a charging trunk and a charging current of all-parallel charging, and compare the charging current of all-parallel charging with the maximum charging current allowed by the charging trunk, and if the maximum charging current allowed by the charging trunk is greater than or equal to the charging current of all-parallel charging, control the switch array module 130 to change the battery units 141 in the series battery pack module 140 to an all-parallel connection, or if the maximum charging current allowed by the charging trunk is less than the charging current of all-parallel charging, control the switch array module 130 to change the battery units 141 in the series battery pack module 140 to a series-parallel connection.

It can be understood that changing the battery units 141 in the series battery pack module 140 from series charging to parallel charging can reduce impact of the differentiated battery unit on a series charging trunk current. However, because a maximum charging current required when a plurality of battery units are connected in parallel often exceeds the maximum charging current allowed by the charging trunk, in this case, an actual charging current provided by the charging trunk to the battery units 141 connected in parallel cannot achieve a maximum charging rate of the battery units 141, and consequently, the charging speed cannot be effectively improved. Therefore, when the maximum charging current allowed by the charging trunk is less than the charging current of all-parallel charging, the switch array module 130 may be controlled to change the battery units 141 in the series battery pack module 140 to a series-parallel connection in order to ensure that a series-parallel charging current is not greater than the maximum charging current allowed by the charging trunk, thereby effectively shortening a charging time of the battery pack.

It can be understood that in this embodiment, connections between the modules and between circuits included in the modules may be direct connections, or may be indirect electrical connections through some interfaces, apparatuses, modules, components, or circuits.

Figure 3:
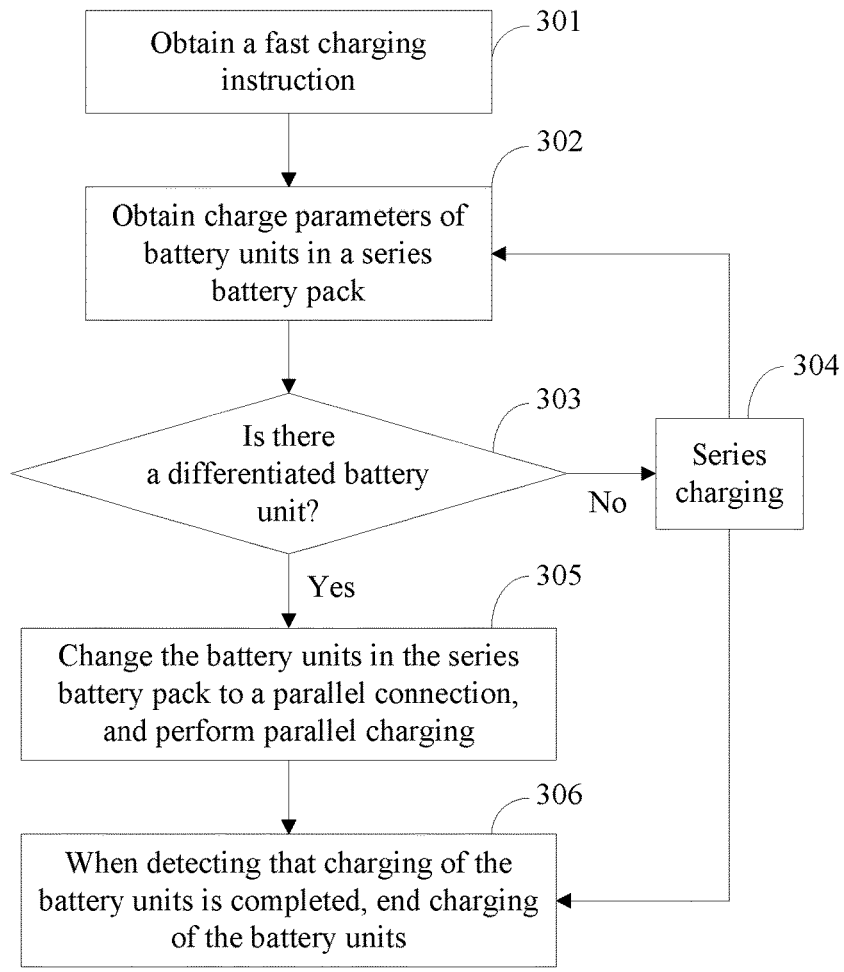
FIG. 3 is a first schematic flowchart of a fast charging method for a series battery pack according to an embodiment of the present disclosure.

Referring to FIG. 3, in an embodiment of the present disclosure, a fast charging method for a series battery pack is provided. The method may be applied to the fast charging system shown in FIG. 1 or FIG. 2. The method includes at least the following steps.

Step 301: Obtain a fast charging instruction.

Step 302: Obtain charge parameters of battery units in a series battery pack.

Step 303: Determine, based on the charge parameters, whether there is a differentiated battery unit in the series battery pack, where the differentiated battery unit is a battery unit whose charge parameter is different from a charge parameter of the rest battery units in the series battery pack.

Step 304: If there is no differentiated battery unit in the series battery pack, perform series charging on the battery units.

Step 305: If there is a differentiated battery unit in the series battery pack, change the battery units in the series battery pack to a parallel connection, and perform parallel charging on the battery units.

Step 306: Monitor charging statuses of the battery units, and when detecting that charging of the battery units is completed, end charging of the battery units.

The fast charging instruction may be obtained by receiving a selection instruction of a user. For example, the user may select a fast charging mode or enter a charging time using an interactive interface, or may select a fast charging switch. Alternatively, the fast charging instruction may be a fast charging instruction automatically generated by a to-be-charged device. No limitation is imposed herein. When a plurality of battery units are used after being connected in a series-parallel combined manner, because of automatic equalization between the battery units, voltages of the battery units are kept essentially the same, and a specific difference lies in capacities of the battery units. In this embodiment, the differentiated battery unit may be determined using a charge parameter of the battery unit. The charge parameter may be a state of charge (SOC) of the battery unit. It can be understood that the differentiated battery unit may be a result of an initial consistency problem between the battery units, or may be a result of failure of a cell in the battery unit.

Figure 4A:
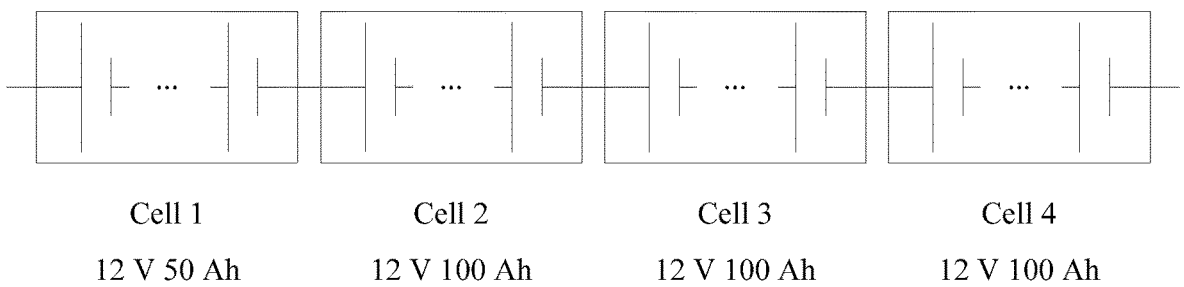
FIG. 4A, FIG. 4B, and FIG. 4C are schematic diagrams of application scenarios of a fast charging method for a series battery pack according to an embodiment of the present disclosure.

Referring to FIG. 4A, in an implementation, it is assumed that the series battery pack includes four battery units, denoted by a cell 1, a cell 2, a cell 3, and a cell 4, respectively, and in normal cases, a rated capacity C of each of the four battery units is 12 volts (V) 100 ampere hours (Ah). In addition, it is assumed that a maximum charging current of each of the battery units is 4C=400 amperes (A) [12 V 400 A]. When there is no differentiated battery unit in the series battery pack, a maximum charging current for charging the series battery units cell 1, cell 2, cell 3, and cell 4 is 4C=400 A [48 V 400 A], and a total charging time is 1C/4C=1/4 hours (h).

In this embodiment, it is assumed that the capacity of the battery unit cell 1 decreases to 12 V 50 Ah because of a failure of some cells in the battery unit cell 1, that a current and a voltage of a charging trunk are not limited, and that withstand currents of a line and a component associated with a charging system are not limited.

1. Referring to FIG. 4A, when four battery units connected in series (4S) all-series charging is performed, a charging current of the charging trunk is limited by the differentiated battery cell 1 to be only a maximum charging current of the cell 1, which is 4C=200 A [48 V 200 A], and a time for full-charging the cell 1 is:

$$T1 = 1C/4C = \frac{1}{4} \text{ h}.$$

In this process, for the cell 2 to the cell 4, a charging current is 2C, and a capacity upon completion of the charging is ¼×2C=½C, when charging continues, the cell 1 may be bypassed using a bypass switch, and charging is performed based on a maximum three battery units connected in series (3S) charging current which is 4C=400 A [36 V 400 A], and a time for full-charging the cell 2 to the cell 4 is:

$$T2 = (1C - \frac{1}{2}C)/4C = \frac{1}{8} \text{ h}.$$

When charging of the all-series battery pack is completed, a total charging time of the entire battery pack is T1+T2=⅜ h.

Figure 4B:
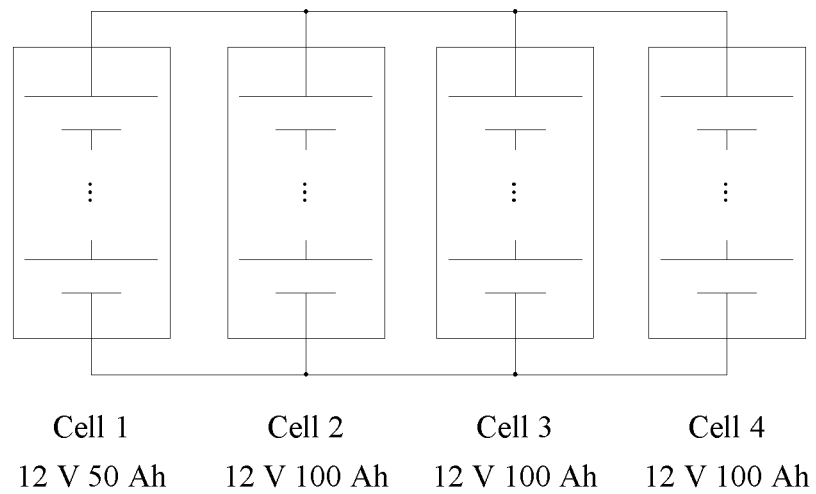

2. Referring to FIG. 4B, if 4S all-series charging is changed to four battery units connected in parallel (4P) all-parallel charging during charging, a maximum charging current is 4×(50+100+100+100)=1400 A [12 V 1400 A], and a total charging time is:

$$T3 = 1C/4C = \frac{1}{4} \text{ h}.$$

Therefore, when all-parallel charging is performed, the charging time of the entire battery pack is ¼ h, which is ⅛ h, around 33.3%, shorter than the all-series charging time. A charging speed can be effectively improved. However, in this case, a charging current of the charging trunk is as high as 1400 A, and impact of limitations on an input current of an external power supply device and an internal charging circuit current needs to be considered.

Figure 4C:
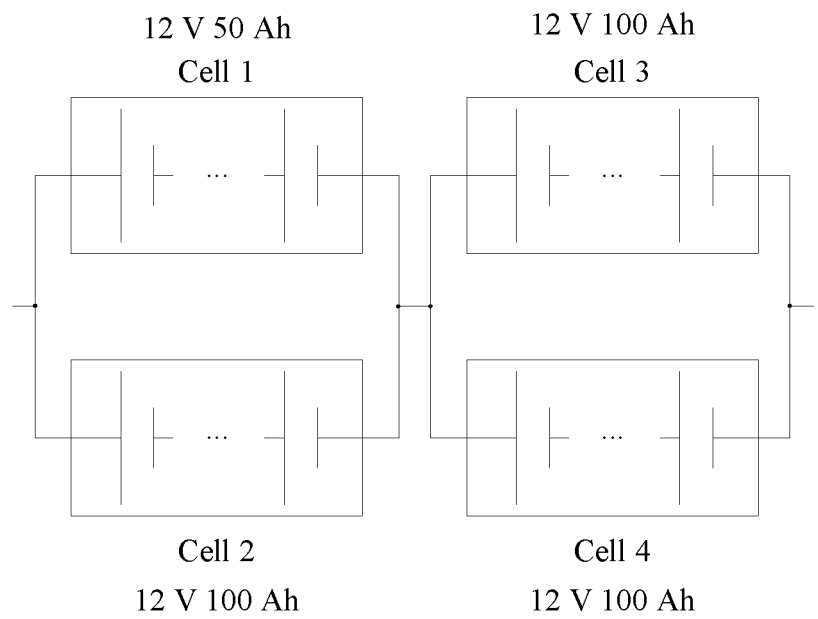

3. Referring to FIG. 4C, if 4S series charging is changed to 2S2P (a two-two parallel connection followed by a series connection) series-parallel charging during charging, a maximum charging current may be 4×(50+100)=600 A [24 V 600 A], a capacity of a first parallel is (50 Ah+100 Ah) which is 4C, and a capacity of a second parallel is (100 Ah+100 Ah) which is 3C, and a time for full-charging the first parallel is:

$$T4=1C/4C=¼ \text{ h}.$$

In this case, a capacity of the second parallel upon completion of the charging is ¼×3C=¾C, and when charging continues, the first parallel needs to be bypassed, and charging is performed based on a 2P charging current which is 4C=800 A [12 V 800 A], and a time for full-charging the second parallel is:

$$T5=(1C-¾C)/4C=1/16 \text{ h}.$$

When 2S2P series-parallel charging is performed, a total charging time of the entire battery pack is $T6=T4+T5=¼+1/16=5/16$ h, which is 1/16 h, around 16.7%, shorter than that of the 4S all-series charging. In this case, a charging current in the charging trunk is much lower than the charging current in the case of 4P all-parallel charging, and requirements on the input current of the external power supply device and an internal charging circuit are relaxed.

It can be learned by comparing the embodiments shown in FIG. 4A to FIG. 4C that, when there is a differentiated battery unit in the series battery pack, changing the battery units in the series battery pack to a parallel connection or a series-parallel connection can effectively increase a charging current, shorten a charging time of the entire series battery pack, and improve charging efficiency.

Figure 5:
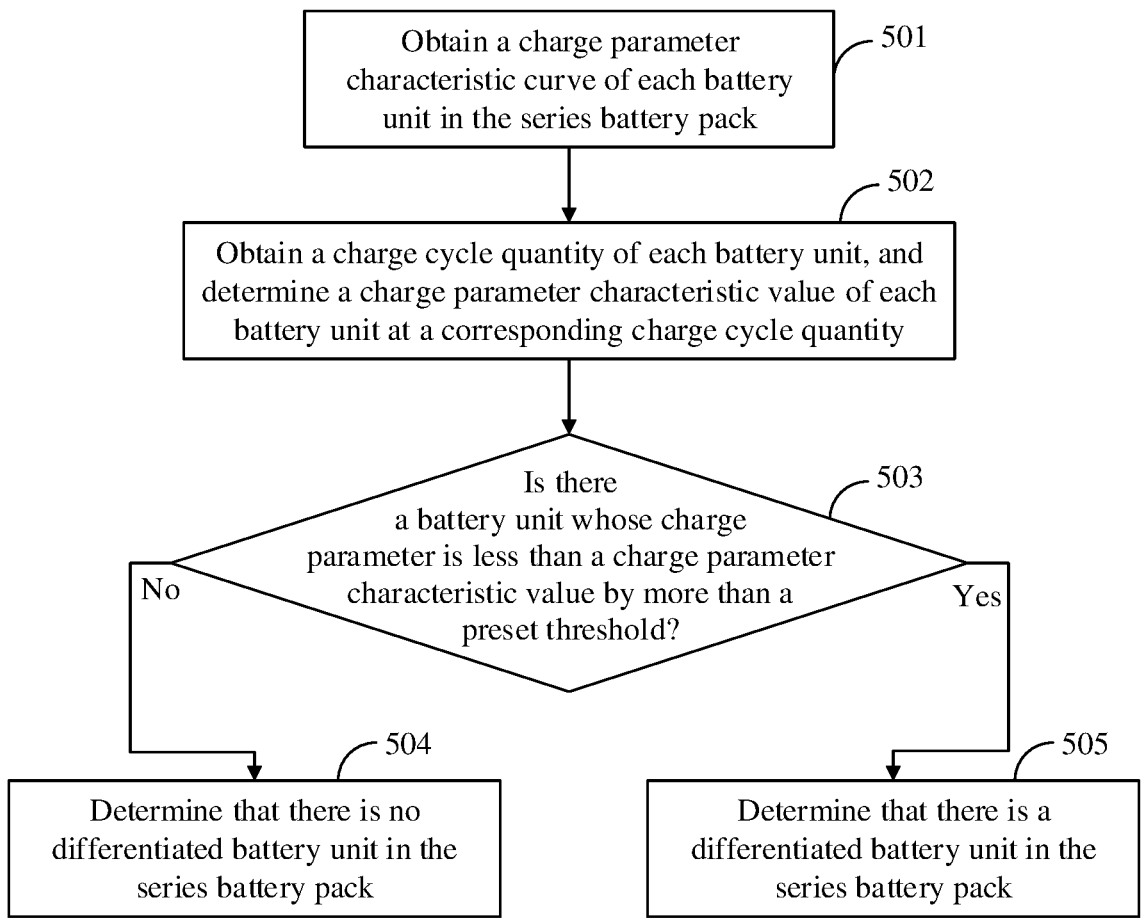
FIG. 5 is a second schematic flowchart of a fast charging method for a series battery pack according to an embodiment of the present disclosure.

Referring to FIG. 5, in an implementation, determining, based on the charge parameters, whether there is a differentiated battery unit in the series battery pack includes the following steps.

Step 501: Obtain a charge parameter characteristic curve of each battery unit in the series battery pack, where the charge parameter characteristic curve is used to define a characteristic how a charge parameter of the battery unit changes with a charge cycle quantity of the battery unit.

Step 502: Obtain a charge cycle quantity of each battery unit in the series battery pack, and determine, based on the charge parameter characteristic curve, a charge parameter characteristic value of each battery unit at a corresponding charge cycle quantity.

Step 503: Compare the charge parameter of each battery unit with the charge parameter characteristic value of the corresponding battery unit.

Step 504: If there is no battery unit whose charge parameter is less than a charge parameter characteristic value by more than a preset threshold, determine that there is no differentiated battery unit in the series battery pack.

Step 505: If there is a battery unit whose charge parameter is less than a charge parameter characteristic value by more than a preset threshold, determine that there is a differentiated battery unit in the series battery pack.

Further, as the charge cycle quantity of the battery unit increases, the charge parameter characteristic value (which is a capacity of a battery when the battery is fully charged in this embodiment) of the battery unit changes according to a specific rule, and usually decreases regularly as the charge cycle quantity increases, thereby forming the charge parameter characteristic curve of the battery unit. It can be understood that the charge parameter characteristic curve of the battery unit is determined by factors such as a selected material and a battery structure of the battery unit, and generally, batteries of a same model have a same charge parameter characteristic curve. Therefore, in this embodiment, the charge parameter characteristic curve and the charge cycle quantity of each battery unit in the series battery pack may be obtained, the charge parameter characteristic value of each battery unit at the corresponding charge cycle quantity is determined based on the charge parameter characteristic curve, and the charge parameter of each battery unit is compared with the charge parameter characteristic value at the corresponding charge cycle quantity in order to determine whether the corresponding battery unit is a differentiated battery unit. Further, the preset threshold may be specified. When a charge parameter of the battery unit is less than a charge parameter characteristic value corresponding to a charge cycle quantity of the battery unit by more than the preset threshold, the battery unit is determined as a differentiated battery unit. For example, it is assumed that a rated capacity of each battery unit in the series battery pack is 100 Ah, and according to a charge parameter characteristic curve of each battery unit, the capacity of each battery unit decreases to 80 Ah after N charge cycles. That is, a charge parameter characteristic value corresponding to N charge cycles is 80 Ah. It is also assumed that the preset threshold is 10%. If it is obtained after N charge cycles that there is a battery unit whose charge parameter is 50 Ah in the series battery pack, because the charge parameter is less than the normal charge parameter characteristic value 80 Ah by more than 10%, the battery unit can be determined as a differentiated battery unit.

In an implementation, the changing the battery units in the series battery pack to a parallel connection, and performing parallel charging on the battery units includes controlling, by controlling switching transistors in a switch array module to be on or off, the battery units in the series battery pack to change to an all-parallel connection, and performing all-parallel charging on the battery units, or controlling, by controlling switching transistors in a switch array module to be on or off, the battery units in the series battery pack to change to a series-parallel connection, and performing series-parallel charging on the battery units.

When all-parallel charging is performed, a highest parallel charging current can be obtained, as well as a highest charging current in a charging trunk and a shortest charging time. When series-parallel charging is performed, because of existence of a series connection, a charging voltage increases correspondingly, and a smaller quantity of parallel batteries can relax a requirement on a current of the charging trunk. The switching transistor in the switch array module may be a MOSFET, a relay, an electronic switch, or the like.

For the all-parallel charging manner, charging of all the battery units is completed simultaneously, and the charging can be ended directly. For the series-parallel charging manner, parallel battery units to which the differentiated battery unit belongs are first fully charged, and in this case, a bypass switch in the switch array module needs to be used to bypass the parallel battery units to continue charging of the remaining series-parallel battery units, and a charging current of a series-parallel charging trunk may be further increased to allow a maximum charging current of the remaining batteries, thereby reducing a charging time.

In an implementation, the ending the charging means ending the charging when it is determined, based on the charge parameters of the battery units, that the batteries are charged to a full-charge threshold or are 100% charged. It can be understood that after the charging of the battery units is ended, the battery units may be changed back to a series connection, alternatively, the battery units may be changed to a parallel connection or a series-parallel connection based on a load power requirement. A discharging scenario of the series battery pack is not limited in this embodiment of the present disclosure.

It can be understood that for specific implementation of the steps in the method embodiment shown in FIG. 3 to FIG. 5, reference may be made to related descriptions in the embodiment shown in FIG. 1 and FIG. 2, and details are not repeated herein.

Figure 6:
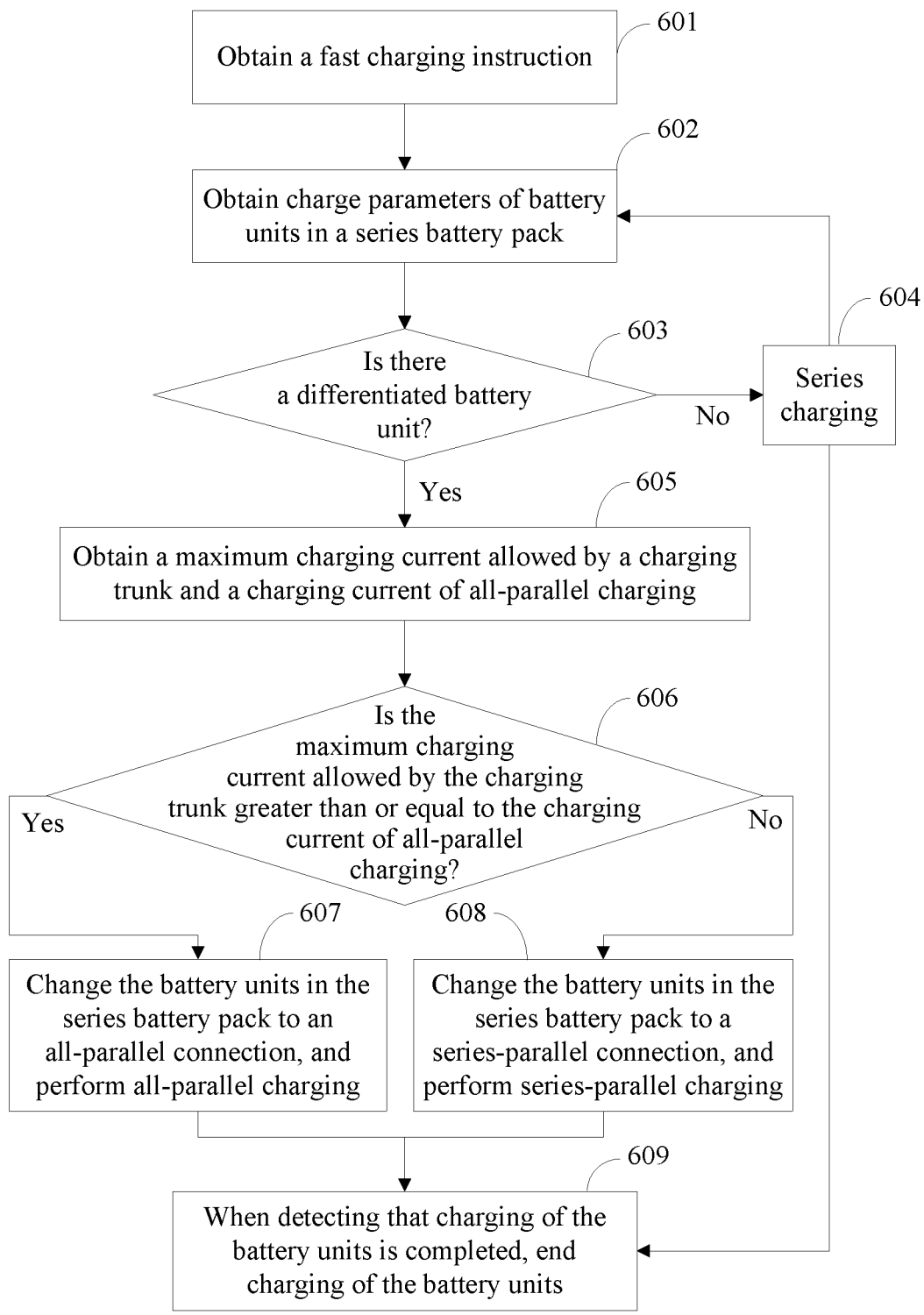
FIG. 6 is a third schematic flowchart of a fast charging method for a series battery pack according to an embodiment of the present disclosure.

Referring to FIG. 6, in an embodiment of the present disclosure, a fast charging method for a series battery pack is provided. The method includes at least the following steps.

Step 601: Obtain a fast charging instruction.

Step 602: Obtain charge parameters of battery units in a series battery pack.

Step 603: Determine, based on the charge parameters, whether there is a differentiated battery unit in the series battery pack.

Step 604: If there is no differentiated battery unit in the series battery pack, perform series charging on the battery units.

Step 605: If there is a differentiated battery unit in the series battery pack, obtain a maximum charging current allowed by a charging trunk and a charging current of all-parallel charging.

Step 606: Compare the charging current of all-parallel charging with the maximum charging current allowed by the charging trunk, to determine whether the maximum charging current allowed by the charging trunk is greater than or equal to the charging current of all-parallel charging.

Step 607: If the maximum charging current allowed by the charging trunk is greater than or equal to the charging current of all-parallel charging, change the battery units in the series battery pack to an all-parallel connection, and perform all-parallel charging on the battery units.

Step 608: If the maximum charging current allowed by the charging trunk is less than the charging current of all-parallel charging, change the battery units in the series battery pack to a series-parallel connection, and perform series-parallel charging on the battery units.

Step 609: Monitor charging statuses of the battery units, and when detecting that charging of the battery units is completed, end charging of the battery units.

It can be understood that steps 601 to 604 in this embodiment are the same as steps 301 to 304 in the embodiment shown in FIG. 3, and reference may be made to related descriptions in the embodiment shown in FIG. 3 for details, and repetitive description is omitted herein.

It can be understood that the maximum charging current allowed by the charging trunk is affected by an external power supply and an internal charging circuit. For example, impact of the internal charging circuit on the maximum charging current allowed by the charging trunk may be impact of factors such as a limited current, and a material, and a cross-sectional area of a cable wire of the charging circuit. This is not described in detail herein. A maximum charging current of each of the battery units is determined by inherent factors such as a selected material and a battery structure of the battery unit, and is usually expressed by a multiple of a rated capacity C of the battery unit. Using a lithium-ion battery as an example, a maximum charging current of a capacity battery may be 0 to 3C, and a maximum charging current of a rate battery may be 0 to 10C. For other batteries, no limitation is imposed herein.

In an implementation, changing the battery units in the series battery pack to a series-parallel connection includes calculating, based on the maximum charging current allowed by the charging trunk and maximum charging currents of the battery units, a maximum quantity of battery units allowed to be connected in parallel, and changing the battery units in the series battery pack to the series-parallel connection based on the maximum quantity of battery units allowed to be connected in parallel.

Further, the maximum charging current allowed by the charging trunk is denoted by Iinput, and the maximum charging currents of the battery units are denoted by Icell. If the series battery pack includes N battery units, when Iinput<N×Icell, a charging current of all-parallel charging may exceed the maximum charging current allowed by the charging trunk, in this case, the N batteries need to be first connected in a series-parallel manner, to reduce a charging current, and when Iinput≥N×Icell, a current of all-parallel charging is not greater than the maximum charging current allowed by the charging trunk, and all-parallel charging can be performed.

That the N batteries are first connected in a series-parallel manner needs to be implemented by calculating, based on the maximum charging current Iinput allowed by the charging trunk and the maximum charging current Icell of each of the battery units, a maximum quantity of battery units that can be connected in parallel. Further, the maximum quantity of battery units that can be connected in parallel is M=Iinput/Icell, and the series battery units in the series battery pack are changed to the series-parallel connection. For example, it is assumed that Iinput is 800 A, that Icell is 400 A, and that the series battery pack includes four battery units. Therefore, the maximum quantity of battery units that can be connected in parallel is M=800/400=2. This means that the four battery units need to undergo a two-two parallel connection before a series connection, to form a 2S2P series-parallel connection.

In an implementation, after the performing series-parallel charging on the battery units, the method further includes monitoring charging statuses of the battery units, if detecting that charging of the differentiated battery unit is completed, making a charging loop bypass the differentiated battery unit using a bypass switching transistor, in a switch array module, connected to the differentiated battery unit, and re-determining a maximum charging current based on a quantity of the remaining battery units, and performing charging on the remaining battery units using the re-determined maximum charging current.

Figure 7A:
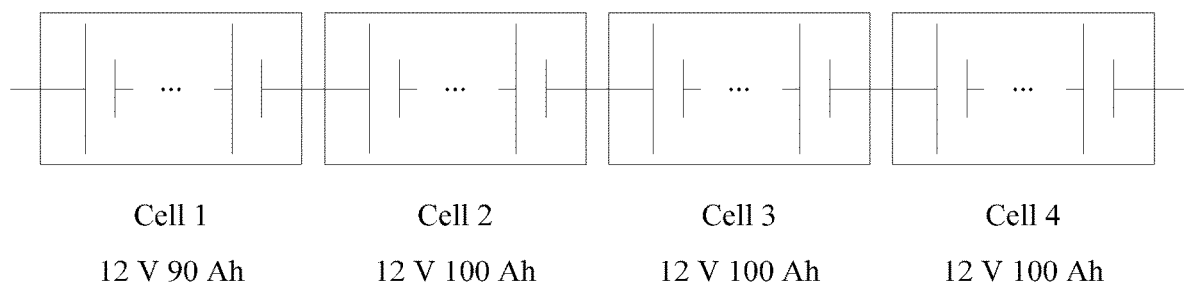
FIG. 7A, FIG. 7B, and FIG. 7C are schematic diagrams of application scenarios of a fast charging method for a series battery pack according to an embodiment of the present disclosure.

Referring to FIG. 7A, in an implementation, it is assumed that the series battery pack includes four battery units, denoted by a cell 1, a cell 2, a cell 3, and a cell 4, respectively, and in normal cases, a rated capacity C of each of the four battery units is 12 V 100 Ah. In addition, it is assumed that a maximum charging current of each of the battery units is 4C=400 A [12 V 400 A]. When there is no differentiated battery unit in the series battery pack, a maximum charging current for charging the series battery units cell 1, cell 2, cell 3, and cell 4 is 4C=400 A [48 V 400 A], and a total charging time is 1C/4C=¼ h.

In this embodiment, it is assumed that the capacity of the battery unit cell 1 decreases to 12 V 90 Ah because of a failure of some cells in the battery unit cell 1, that a current and a voltage of a charging trunk are not limited, and that withstand currents of a line and a component associated with a charging system are not limited.

1. Referring to FIG. 7A, when 4S (four battery units connected in series) all-series charging is performed, a charging current of the charging trunk is limited by the differentiated battery cell 1 to be only a maximum charging current of the cell 1, which is 4C=360 A [48 V 360 A], and a time for full-charging the cell 1 is:

$$T1=1C/4C=¼ \text{ h}.$$

In this process, for the cell 2 to the cell 4, a charging current is 3.6C, and a capacity upon completion of the charging is ¼×3.6C=0.9C, when charging continues, the cell 1 may be bypassed using a bypass switch, and charging is performed based on a maximum 3S (three battery units connected in series) charging current which is 4C=400 A [36 V 400 A], and a time for full-charging the cell 2 to the cell 4 is:

$$T2=(1C-0.9C)/4C=1/40 \text{ h}.$$

When charging of the all-series battery pack is completed, a total charging time of the entire battery pack is T1+T2=11/40 h.

Figure 7B:
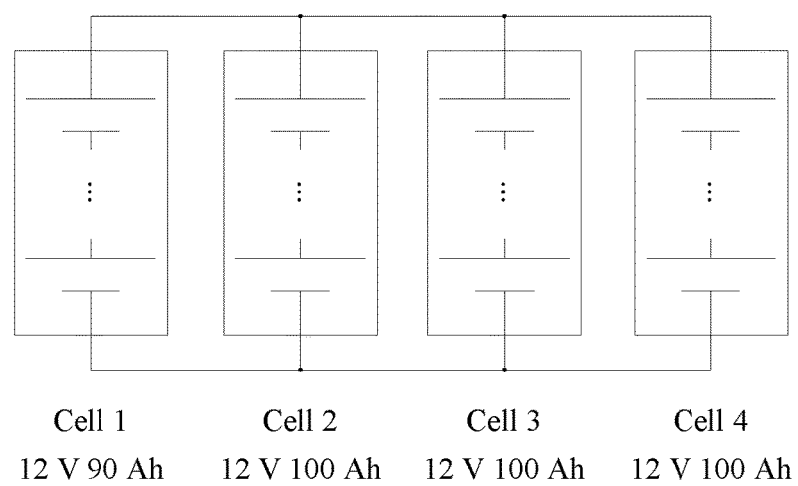

2. Referring to FIG. 7B, if 4S all-series charging is changed to 4P all-parallel charging during charging, a maximum charging current is 4×(90+100+100+100)=1560 A [12 V 1560 A], and a total charging time is:

$$T3=1C/4C=¼ \text{ h}.$$

Therefore, when all-parallel charging is performed, the charging time of the entire battery pack is ¼ h, which is 1/40 h, around 9.1%, shorter than the all-series charging time. A charging speed can be effectively improved. However, in this case, a charging current of the charging trunk is as high as 1560 Ah, and impact of limitations on an input current of an external power supply device and an internal charging circuit current needs to be considered.

Figure 7C:
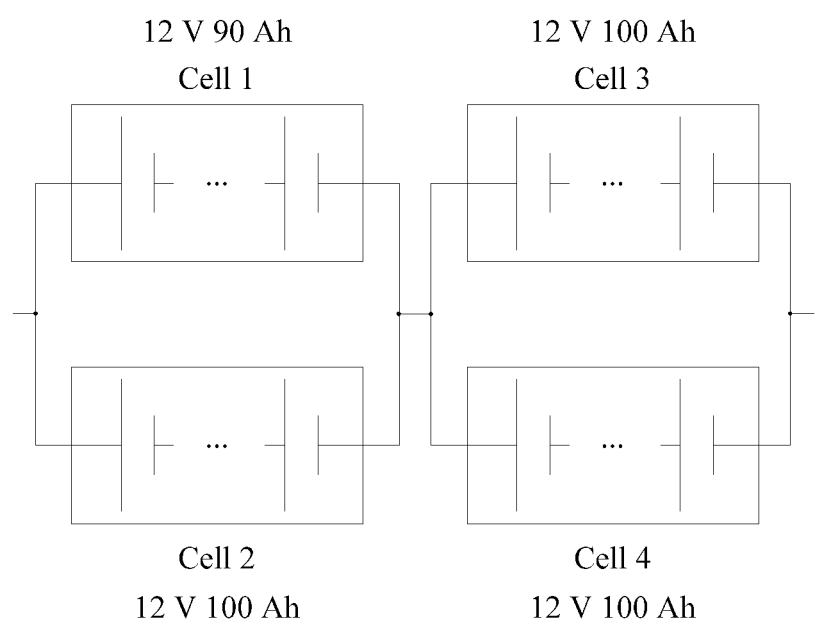

3. Referring to FIG. 7C, if 4S series charging is changed to 2S2P (a two-two parallel connection followed by a series connection) series-parallel charging during charging, a maximum charging current may be 4×(90+100)=760 A [24 V 760 A], a capacity of a first parallel is (90 Ah+100 Ah) which is 4C, and a capacity of a second parallel is (100 Ah+100 Ah) which is 3.8C, and a time for full-charging the first parallel is:

$$T4=1C/4C=¼ \text{ h}.$$

In this case, a capacity of the second parallel upon completion of the charging is ¼×3.8C=3.8/4C, and when charging continues, the first parallel needs to be bypassed, and charging is performed based on a 2P charging current which is 4C=800 A [12 V 800 A], and a time for full-charging the second parallel is:

$$T5=(1C-3.8/4C)/4C=1/80 \text{ h}.$$

When 2S2P series-parallel charging is performed, a total charging time of the entire battery pack is T6=T4+T5=21/80 h, which is 1/80 h, around 4.5%, shorter than that of the 4S all-series charging. In this case, a charging current in the charging trunk is much lower than the charging current in the case of 4P all-parallel charging, and requirements on the input current of the external power supply device and an internal charging circuit are relaxed.

It can be learned by comparing the embodiments shown in FIG. 7A to FIG. 7C that, when the maximum charging current allowed by the charging trunk is less than the charging current of all-parallel charging, the battery units in the series battery pack are changed to a series-parallel connection, and series-parallel charging is performed. This can effectively shorten a charging time in comparison with all-series charging, and allow a lower charging current in comparison with all-parallel charging, without being limited by the input current of the external power supply device and the internal charging circuit.

Figure 8:
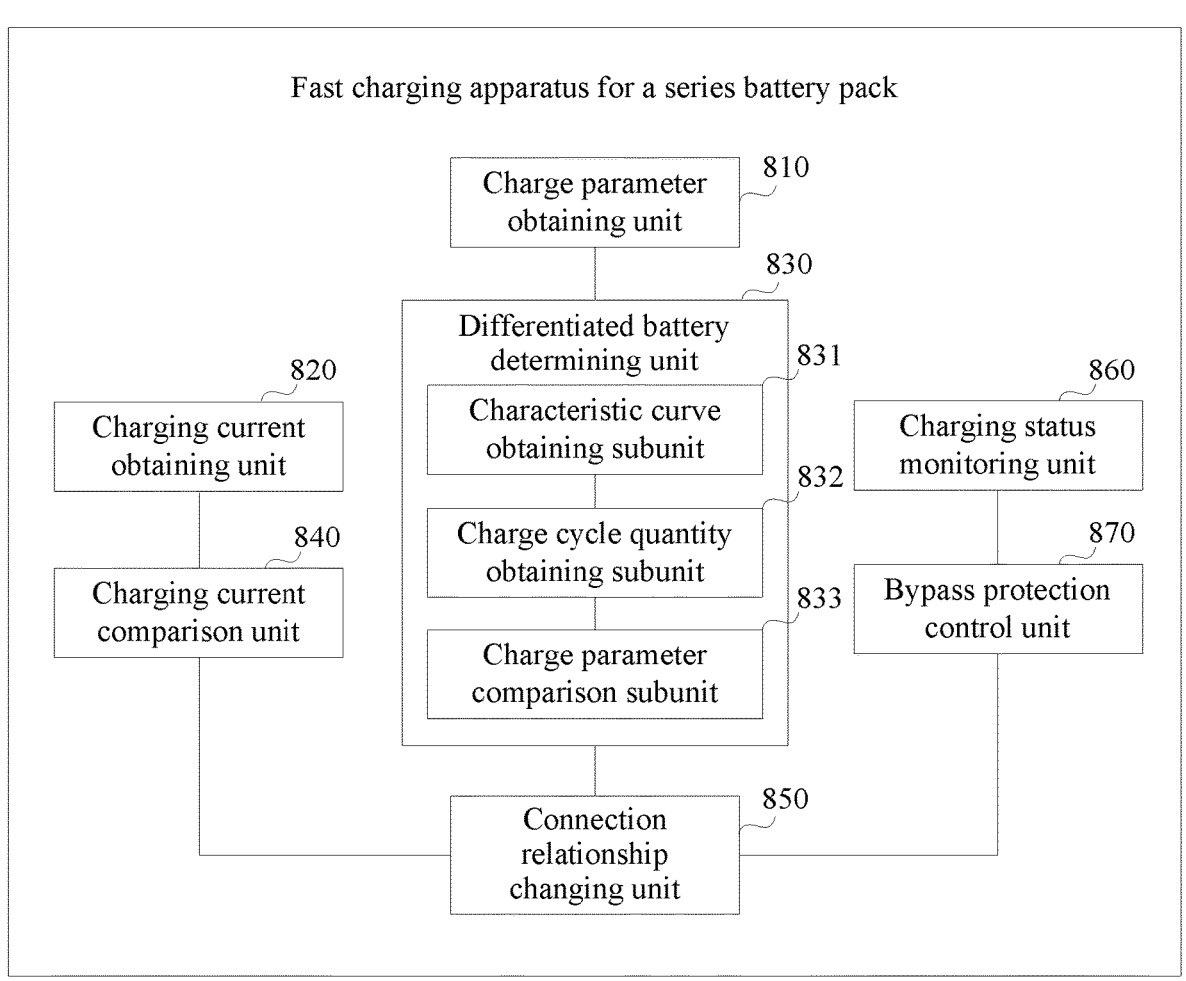
FIG. 8 is a schematic structural diagram of a fast charging apparatus for a series battery pack according to an embodiment of the present disclosure.

Referring to FIG. 8, in an embodiment of the present disclosure, a fast charging apparatus 800 for a series battery pack is provided. The apparatus 800 includes a charge parameter obtaining unit 810 configured to obtain charge parameters of battery units in a series battery pack, a differentiated battery determining unit 830 configured to determine, based on the charge parameters, whether there is a differentiated battery unit in the series battery pack, where the differentiated battery unit is a battery unit whose charge parameter is different from a charge parameter of the rest battery units in the series battery pack, and a connection relationship changing unit 850 configured to, when there is a differentiated battery unit in the series battery pack, change the battery units in the series battery pack to a parallel connection, and perform parallel charging on the battery units.

In an implementation, the differentiated battery determining unit 830 includes a characteristic curve obtaining subunit 831 configured to obtain a charge parameter characteristic curve of each battery unit in the series battery pack, where the charge parameter characteristic curve is used to define a characteristic how a charge parameter of the battery unit changes with a charge cycle quantity of the battery unit, a charge cycle quantity obtaining subunit 832 configured to obtain a charge cycle quantity of each battery unit in the series battery pack, and determine, based on the charge parameter characteristic curve, a charge parameter characteristic value of each battery unit at a corresponding charge cycle quantity, and a charge parameter comparison subunit 833 configured to compare the charge parameter of each battery unit with the charge parameter characteristic value of the corresponding battery unit, and if there is a battery unit whose charge parameter is less than a charge parameter characteristic value by more than a preset threshold, determine that there is a differentiated battery unit in the series battery pack.

In an implementation, the connection relationship changing unit 850 is further configured to control, by controlling switching transistors in a switch array module to be on or off, the battery units in the series battery pack to change to an all-parallel connection, and perform all-parallel charging on the battery units, or control, by controlling switching transistors in a switch array module to be on or off, the battery units in the series battery pack to change to a series-parallel connection, and perform series-parallel charging on the battery units.

In an implementation, the fast charging apparatus 800 for a series battery pack further includes a charging current obtaining unit 820 configured to obtain a maximum charging current allowed by a charging trunk and a charging current of all-parallel charging, and a charging current comparison unit 840 configured to compare the charging current of all-parallel charging with the maximum charging current allowed by the charging trunk.

If the maximum charging current allowed by the charging trunk is greater than or equal to the charging current of all-parallel charging, the connection relationship changing unit 850 is further configured to change the battery units in the series battery pack to an all-parallel connection, and perform all-parallel charging on the battery units.

If the maximum charging current allowed by the charging trunk is less than the charging current of all-parallel charging, the connection relationship changing unit 850 is further configured to change the battery units in the series battery pack to a series-parallel connection, and perform series-parallel charging on the battery units.

In an implementation, the charging current comparison unit 840 is further configured to calculate, based on the maximum charging current allowed by the charging trunk and maximum charging currents of the battery units, a maximum quantity of battery units allowed to be connected in parallel, and the connection relationship changing unit 850 is further configured to change the battery units in the series battery pack to the series-parallel connection based on the maximum quantity of battery units allowed to be connected in parallel.

In an implementation, the fast charging apparatus 800 for a series battery pack further includes a charging status monitoring unit 860 configured to monitor charging statuses of the battery units, and a bypass protection control unit 870 configured to when the charging status monitoring unit 860 detects that charging of the differentiated battery unit is completed, make a charging loop bypass the differentiated battery unit using a bypass switching transistor, in a switch array module, connected to the differentiated battery unit, and the charging current comparison unit 840 is further configured to re-determine a maximum charging current based on a quantity of the remaining battery units, and perform charging on the remaining battery units using the re-determined maximum charging current.

In an implementation, the charging status monitoring unit 860 is further configured to monitor charging statuses of the battery units, and if detecting that charging of the battery units is completed, end charging of the battery units, and the connection relationship changing unit 850 is further configured to change the battery units back to a series connection, or change the battery units to a parallel connection or a series-parallel connection based on a load power requirement.

It can be understood that, for functions and specific implementation of the units in the fast charging apparatus 800 for a series battery pack in this embodiment, reference may be made to related descriptions in the embodiment shown in FIG. 1 and FIG. 2 and the method embodiments shown in FIG. 3 to FIG. 7, and details are not repeated herein.

It may be understood that in the several embodiments provided in this application, it should be understood that the disclosed system, method, and apparatus may be implemented in other manners. For example, the described apparatus embodiments are merely examples. The module division is merely logical function division and may be other division in actual implementation. For example, a plurality of units may be combined or integrated into another system, or some features may be ignored or not performed. In an implementation, the apparatus is stored in a memory in a form of an executable program module and is called and executed by a processor such that the processor controls the modules in the fast charging system to perform corresponding operations, to implement fast charging of the series battery pack.

It may be understood that a sequence of the steps of the method in the embodiments of the present disclosure may be adjusted, and particular steps may be merged or deleted based on an actual requirement. Correspondingly, the units in the apparatus in the embodiments of the present disclosure may be combined, divided, or deleted based on an actual requirement.

What are disclosed above are merely embodiments of the present disclosure, and certainly are not intended to limit the protection scope of the present disclosure. A person of ordinary skill in the art may understand that all or some of processes that implement the foregoing embodiments and equivalent modifications made in accordance with the claims of the present disclosure shall fall within the scope of the present disclosure.

What is claimed is:

1. A fast charging method for a series battery pack, comprising:
   obtaining charge parameters of battery units in the series battery pack;
   determining, based on the charge parameters, whether there is a differentiated battery unit in the series battery pack, wherein the differentiated battery unit is a battery unit whose charge parameter is different from charge parameters of remaining battery units in the series battery pack;
   changing the battery units to a parallel coupling when there is the differentiated battery unit in the series battery pack;
   performing parallel charging on the battery units;
   monitoring charging statuses of the battery units;
   detecting that charging of the battery units is completed;
   ending the charging of the battery units; and
   changing the battery units to one of: a series coupling, a series-parallel coupling, or the parallel coupling based on a load power requirement.

2. The fast charging method of claim 1, wherein determining whether there is the differentiated battery unit in the series battery pack comprises:
   obtaining a charge parameter characteristic curve of each battery unit, wherein the charge parameter characteristic curve defines a characteristic of how a charge parameter of a corresponding battery unit changes with a charge cycle quantity of the corresponding battery unit;
   obtaining a charge cycle quantity of each battery unit in the series battery pack;
   determining, based on the charge parameter characteristic curve of each battery unit, a charge parameter characteristic value of each battery unit at a corresponding charge cycle quantity;
   comparing the charge parameter of the corresponding battery unit with a charge parameter characteristic value of the corresponding battery unit;
   identifying that there is a battery unit whose charge parameter is less than a charge parameter characteristic value by more than a preset threshold; and
   determining, in response to the identifying, that there is the differentiated battery unit in the series battery pack.

3. The fast charging method of claim 2, wherein the obtained charge parameter characteristic curve is based on a selected material and a battery structure of the battery unit.

4. The fast charging method of claim 1, wherein changing the battery units in the series battery pack to the parallel coupling and performing the parallel charging on the battery units comprises:
   controlling switching transistors in a switch array to be on or off to change the battery units in the series battery pack to an all-parallel coupling; and
   performing all-parallel charging on the battery units.

5. The fast charging method of claim 1, wherein before changing the battery units in the series battery pack to the parallel coupling, the fast charging method further comprises:
obtaining a maximum charging current allowed by a charging trunk and a charging current of all-parallel charging; and
comparing the charging current with the maximum charging current.

6. The fast charging method of claim 5, wherein the maximum charging current allowed by the charging trunk is greater than or equal to the charging current of the all-parallel charging, and wherein changing the battery units in the series battery pack to the parallel coupling and performing the parallel charging on the battery units comprises:
changing the battery units in the series battery pack to an all-parallel coupling; and
performing the all-parallel charging on the battery units.

7. The fast charging method of claim 5, wherein the maximum charging current is less than the charging current, and wherein changing the battery units in the series battery pack to the parallel coupling and performing the parallel charging on the battery units comprises:
changing the battery units in the series battery pack to a series-parallel coupling; and
performing series-parallel charging on the battery units.

8. The fast charging method of claim 7, wherein changing the battery units in the series battery pack to the series-parallel coupling comprises:
calculating, based on the maximum charging current allowed by the charging trunk and maximum charging currents of the battery units, a maximum quantity of battery units allowed to be coupled in parallel; and
changing the battery units in the series battery pack to the series-parallel coupling based on the maximum quantity of the battery units allowed to be coupled in parallel.

9. The fast charging method of claim 7, wherein after performing the series-parallel charging on the battery units, the fast charging method further comprises:
monitoring charging statuses of the battery units;
detecting that charging of the differentiated battery unit is completed;
triggering, in response to the detecting, a charging loop to bypass the differentiated battery unit using a bypass switching transistor in a switch array coupled to the differentiated battery unit;
re-determining a new maximum charging current based on a quantity of the remaining battery units; and
performing charging on the remaining battery units using the new maximum charging current.

10. The fast charging method of claim 1, wherein changing the battery units in the series battery pack to the parallel coupling and performing the parallel charging on the battery units comprises:
controlling switching transistors in a switch array to be on or off to change the battery units in the series battery pack to a series-parallel coupling; and
performing series-parallel charging on the battery units.

11. A fast charging system, comprising:
a charging control circuit;
an alternating current (AC)/direct current (DC) conversion circuit coupled to the charging control circuit and configured to convert an AC signal from an external power supply to a DC signal; and
a series battery pack coupled to the charging control circuit using a switch array, wherein the series battery pack comprises a plurality of battery units coupled in series, and
wherein the charging control circuit is configured to:
obtain charge parameters of the battery units;
obtain a charge parameter characteristic curve of each battery unit;
obtain a charge cycle quantity of each battery unit in the series battery pack;
determine, based on the charge parameter characteristic curve of each battery unit, a charge parameter characteristic value of each battery unit at a corresponding charge cycle quantity;
compare the charge parameter of the corresponding battery unit with a charge parameter characteristic value of the corresponding battery unit;
identify that there is a battery unit whose charge parameter is less than a charge parameter characteristic value by more than a preset threshold;
determine, in response to the identifying, whether there is a differentiated battery unit in the series battery pack, wherein the differentiated battery unit is a battery unit whose charge parameter is different from charge parameters of remaining battery units in the series battery pack;
control the switch array to change the battery units in the series battery pack to an all-parallel coupling or a series-parallel coupling when there is the differentiated battery unit in the series battery pack; and
perform all-parallel charging or series-parallel charging on the battery units using the DC signal.

12. The fast charging system of claim 11, wherein the charging control circuit is further configured to:
obtain a maximum charging current allowed by a charging trunk and a charging current of the all-parallel charging;
compare the charging current with the maximum charging current; and
control the switch array to change the battery units in the series battery pack to the all-parallel coupling when the maximum charging current is greater than or equal to the charging current.

13. The fast charging system of claim 11, wherein the switch array comprises a plurality of switching transistors and a plurality of bypass switches, wherein each of the switching transistors is coupled to at least one of the battery units, wherein each of the bypass switches is coupled to the at least one of the battery units, and wherein the switch array is configured to:
change an on or off state of the switching transistors to change the battery units among a series coupling, a parallel coupling, and the series-parallel coupling; and
implement charging protection or discharging protection on the battery units by changing an on or off state of the bypass switches.

14. The fast charging system of claim 13, wherein the charging control circuit comprises a charging power adjustment circuit and a charging monitoring circuit, wherein the charging power adjustment circuit is configured to:
obtain a charging power requirement of the battery units that have been changed to the all-parallel coupling or the series-parallel coupling; and
adjust a charging power based on the charging power requirement, and wherein the charging monitoring circuit is configured to:
monitor charging status parameters of the battery units; and
control the bypass switches in the switch array to be on or off based on the charging status parameters to implement the charging protection on the battery units.

15. The fast charging system of claim 13, wherein the fast charging system further comprises a discharging control circuit coupled to the series battery pack using the switch array and configured to:
obtain a load power requirement; and
control, based on the load power requirement, the switch array to adjust a discharging power of the series battery pack.

16. The fast charging system of claim 15, wherein the discharging control circuit comprises a discharging power adjustment circuit and a discharging monitoring circuit, wherein the discharging power adjustment circuit is configured to control the switching transistors in the switch array to be on or off to change the battery units in the series battery pack to the parallel coupling or the series-parallel coupling based on the load power requirement, and wherein the discharging monitoring circuit is configured to:
monitor discharging status parameters of the battery units; and
control the bypass switches in the switch array to be on or off based on the discharging status parameters to implement the discharging protection on the battery units.

17. The fast charging system of claim 11, further comprising a DC/DC conversion circuit coupled to the series battery pack and configured to:
convert a low-voltage DC signal from the series battery pack to a high-voltage DC signal; and
supply power to a load using the high-voltage DC signal.

18. The fast charging system of claim 11, wherein the charging control circuit is further configured to:
obtain a maximum charging current allowed by a charging trunk and a charging current of the all-parallel charging;
compare the charging current with the maximum charging current; and
control the switch array to change the battery units in the series battery pack to the series-parallel coupling when the maximum charging current is less than the charging current.

19. The fast charging system of claim 11, wherein the obtained charge parameter characteristic curve is based on a selected material and a battery structure of the battery unit.

20. The fast charging system of claim 11, wherein the charge parameter characteristic curve defines a characteristic of how a charge parameter of a corresponding battery unit changes with a charge cycle quantity of the corresponding battery unit.

* * * * *